US011600307B2

(12) United States Patent
Li et al.

(10) Patent No.: US 11,600,307 B2
(45) Date of Patent: Mar. 7, 2023

(54) MEMORY CIRCUIT ARCHITECTURE

(71) Applicant: QUALCOMM Incorporated, San Diego, CA (US)

(72) Inventors: David Li, San Diego, CA (US); Rahul Biradar, Kalaburgi (IN); Biju Manakkam Veetil, Bengaluru (IN); Po-Hung Chen, Los Angeles, CA (US); Ayan Paul, San Diego, CA (US); Sung Son, San Jose, CA (US); Shivendra Kushwaha, New Delhi (IN); Ravindra Reddy Chekkera, Vemula (IN); Derek Yang, San Diego, CA (US)

(73) Assignee: QUALCOMM INCORPORATED, San Diego, CA (US)

(*) Notice: Subject to any disclaimer, the term of this patent is extended or adjusted under 35 U.S.C. 154(b) by 0 days.

(21) Appl. No.: 17/136,616

(22) Filed: Dec. 29, 2020

(65) Prior Publication Data
US 2022/0208232 A1    Jun. 30, 2022

(51) Int. Cl.
| | |
|---|---|
| G11C 5/02 | (2006.01) |
| G11C 7/06 | (2006.01) |
| G11C 7/10 | (2006.01) |
| G11C 8/08 | (2006.01) |
| G11C 8/10 | (2006.01) |

(52) U.S. Cl.
CPC ............. *G11C 5/025* (2013.01); *G11C 7/06* (2013.01); *G11C 7/1069* (2013.01); *G11C 7/1096* (2013.01); *G11C 8/08* (2013.01); *G11C 8/10* (2013.01)

(58) Field of Classification Search
CPC ......... G11C 5/025; G11C 7/06; G11C 7/1069; G11C 7/1096; G11C 8/08; G11C 8/10

USPC .................................................. 365/189.14
See application file for complete search history.

(56) References Cited

U.S. PATENT DOCUMENTS

| | | | |
|---|---|---|---|
| 5,617,555 | A | 4/1997 | Patel et al. |
| 8,780,652 | B2 | 7/2014 | Wang et al. |
| 8,913,440 | B2 | 12/2014 | Tao et al. |
| 8,929,154 | B2 | 1/2015 | Chang et al. |

(Continued)

FOREIGN PATENT DOCUMENTS

WO    WO 0026917    *    5/2000

OTHER PUBLICATIONS

International Search Report and Written Opinion—PCT/US2021/062470—ISA/EPO—dated Mar. 23, 2022.

*Primary Examiner* — Huan Hoang
(74) *Attorney, Agent, or Firm* — Haynes and Boone, LLP

(57) ABSTRACT

A semiconductor device includes: a memory circuit having a plurality of quadrants arranged at corners of the memory circuit and surrounding a bank control component; wherein a first quadrant of the plurality of quadrants includes a first bit cell core and a first set of input output circuits configured to access the first bit cell core, the first quadrant defined by a rectangular boundary that encloses portions of two perpendicular edges of the memory circuit; wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical.

41 Claims, 9 Drawing Sheets

(56) References Cited

U.S. PATENT DOCUMENTS

| | | |
|---|---|---|
| 8,988,948 B2 | 3/2015 | Tao et al. |
| 10,388,364 B2 | 8/2019 | Ishizu et al. |
| 2004/0223398 A1 | 11/2004 | Brown et al. |
| 2006/0120125 A1* | 6/2006 | Kajigaya ................ G11C 29/50 365/2 |
| 2008/0112251 A1 | 5/2008 | Youn et al. |
| 2008/0123423 A1 | 5/2008 | Kim |
| 2011/0261628 A1 | 10/2011 | Keeth et al. |

* cited by examiner

MEMORY CIRCUIT ARCHITECTURE

TECHNICAL FIELD

The present application relates, generally, to memory circuits and, more specifically, to memory circuit architecture and methods for using such memory circuit.

BACKGROUND

A conventional computing device (e.g., smart phone, tablet computer, etc.) may include a system on chip (SOC), which has a processor and other operational circuits. The SOC may also include random-access memory (RAM) implemented as static RAM (SRAM), dynamic RAM (DRAM), as well as various read-only memories (ROMs). RAM may be implemented within a processor, such as a central processing unit (CPU), graphics processing unit (GPU), or outside of a processor.

Currently, some CPU architectures use many wide input output (I/O) memory instances operating at 3 GHz and above. However, a wide I/O implementation at high frequencies may impact memory performance due to a resistive capacitive (RC) effect. One approach is to break larger memory circuit instances into smaller memory, circuit instances, which may reduce some of the RC effect and provide acceptable performance for 3 GEL and above. However, such approaches may also duplicate hardware, therefore incurring a leakage penalty and area penalty. Furthermore, such solutions may use routing tracks to merge the memories, and those routing tracks may themselves incur some amount of RC effect.

Another proposal is to use repeaters to support multiple memory circuits arranged horizontally within a single instance. However, repeaters may experience lower speed and may in some instances not be suitable for 3 GHz implementations. Also, such implementations may increase wordline routing complexity.

Accordingly, there is a need in the art for more memory architectures that achieve a better trade-off between performance, power, and area (PPA) in systems that use memories.

SUMMARY

Various implementations provide a memory architecture providing better performance, power, and area (PPA) than existing systems. Implementations include a memory circuit having quadrants, which are arranged at corners of the memory circuit and surround a bank control component. A bank control component may receive instructions and addresses, pre-decode those addresses, and control row decoders to access particular wordlines within memory cores for both read and write access. A bank control component may include a global bank controller, a local bank controller, and/or portions thereof. Global bank controller and local bank controllers are discussed in more detail below with respect to FIG. 1. The memory circuit may be symmetrical about an axis that is parallel to wordlines in the quadrants (e.g., the x-axis or horizontal axis). Additionally, some devices may also be symmetrical about the y-axis. Some implementations include methods of using a memory circuit having that architecture.

According to one implementation, a semiconductor device includes: a memory circuit having a plurality of quadrants arranged at corners of the memory circuit and surrounding a bank control component; wherein a first quadrant of the plurality of quadrants includes a first bit cell core and a first set of input output circuits configured to access the first bit cell core, the first quadrant defined by a rectangular boundary that encloses portions of two perpendicular edges of the memory circuit; and wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical. For example, the second quadrant of the plurality of quadrants may be horizontal axis symmetrical with respect to the first quadrant; and a third quadrant of the plurality of quadrants may be vertical axis symmetrical with respect to the first quadrant.

According to another implementation, there is provided a method of operating a semiconductor device, the method including: performing an input output operation on a memory circuit, including receiving an enable signal directed toward a first quadrant of a plurality of quadrants arranged at corners of the memory circuit and surrounding a bank control component; wherein the first quadrant of the plurality of quadrants includes a first bit cell core and a first set of input output circuits configured to access the first bit cell core, the first quadrant defined by a rectangular boundary that encloses portions of two perpendicular edges of the memory circuit; wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical; wherein performing the input output operation on the memory circuit includes performing pre-decoding at the bank control component and activating wordline drivers in a row decoder according to the pre-decoding.

According to another implementation, a system on chip (SOC) includes: a random-access memory (RAM) device comprising a plurality of quadrants arranged around corners of a rectangular shape of the RAM device; wherein a first quadrant of the plurality of quadrants is defined by a first boundary that encloses portions of two perpendicular edges of the RAM device; wherein a second quadrant of the plurality of quadrants is horizontal axis symmetrical with respect to the first quadrant; and wherein a third quadrant of the plurality of quadrants is vertical axis symmetrical with respect to the first quadrant.

According to another implementation, a system on chip (SOC) includes: a memory circuit having a plurality of quadrants arranged at corners of the memory circuit and surrounding means for pre-decoding address signals; wherein a first quadrant of the plurality of quadrants includes first means for storing data and a first set of input output circuits configured to access the first data storing means, the first quadrant defined by a rectangular boundary that encloses portions of two perpendicular edges of the memory circuit; wherein a second quadrant of the plurality of quadrants includes second means for storing data and a second set of input output circuits configured to access the second data storing means, wherein a border between the first quadrant and the second quadrant defines a first axis about which the first quadrant and the second quadrant are symmetrical.

According to another implementation, a semiconductor device includes: a memory circuit having a plurality of quadrants arranged at corners of the memory circuit and surrounding a bank control component; wherein a first quadrant of the plurality of quadrants includes a first bit cell core, the first quadrant defined by a rectangular boundary that encloses portions of two perpendicular edges of the memory circuit; and wherein a second quadrant of the plurality of quadrants includes a second bit cell core, the second quadrant being adjacent the first quadrant; wherein a border between the first quadrant and the second quadrant defines a first axis about which the first quadrant and the second quadrant are symmetrical.

DETAILED DESCRIPTION

Figure 1:
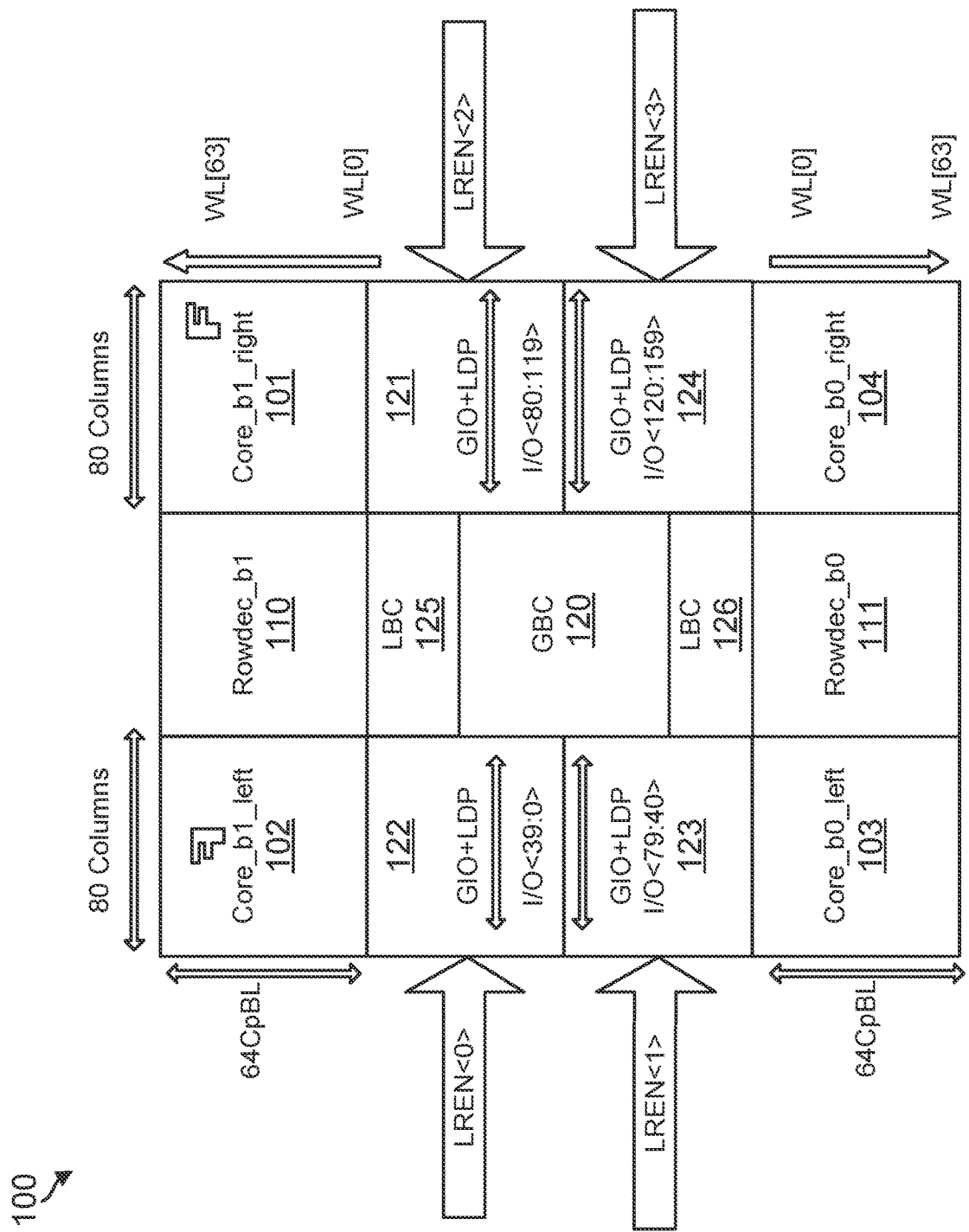
FIG. 1 is a simplified diagram illustrating an example memory circuit, according to one implementation.

Various implementations provided herein include a memory architecture that provides a better balance of performance, power, and area (PPA) than other solutions. An example architecture includes a folded architecture, which is symmetrical about an axis parallel to wordlines in the memory bit cell cores. The example architecture includes quadrants arranged around a bank control component, which provides control for each of the quadrants. Some examples may also be symmetrical about an axis perpendicular to the direction of the wordlines, thereby providing at least two axes of symmetry.

Continuing with the example, the architecture may include a first quadrant, which includes a first bit cell core and a first set of input output circuits that serve the first bit cell core. This first quadrant may be defined by a rectangular boundary that encloses portions of two perpendicular edges of the memory circuit. For instance, a quadrant in an upper left-hand corner may include within its rectangular boundary a vertical edge of the memory circuit on the left-hand side and a horizontal edge of the memory circuit on an upper side of the memory circuit. The directional adjectives used to describe the quadrants left, right, upper, and lower—are described in more detail below with respect to FIG. 1. Such directional adjectives are used for ease of understanding and are not used to limit the memory circuit from being positioned according to any particular coordinate system.

The memory circuit may also include a second quadrant, which includes a second bit cell core and a second set of input output circuits configured to access the second bit cell core. The second quadrant is adjacent to the first quadrant, and a border between the first quadrant and the second quadrant defines a first axis about which the first quadrant and the second quadrant are symmetrical. For instance, the first quadrant may include an upper left-hand quadrant, and the second quadrant may include a lower left-hand quadrant. In another example, the first quadrant may include an upper right-hand quadrant, and the second quadrant may include a lower right-hand quadrant. In any event, the first and second quadrants are symmetrical about their shared border.

The architecture may also include a third quadrant that includes a third bit cell core and a third set of input output circuits. The third quadrant may be symmetrical with the first quadrant along a second axis that is perpendicular to the first axis. For instance, if the first and second quadrants are symmetrical about the first axis, then the first and third quadrants may be symmetrical about a second axis. A fourth quadrant may also be symmetrical with the second quadrant about the second axis.

In some implementations, the first and second quadrants may be separated from the third and fourth quadrants by row decoders and a shared bank control component, such as a global bank controller (GBC). Thus, the first and third quadrants may share a row decoder block, and the second and fourth quadrants may share a row decoder block. The GBC may include various circuits, such as pre-decoding circuitry operable to select individual row decoding circuits within a row decoder block.

Furthermore, some examples may include a method of operating a memory circuit, where the memory circuit is structured according to the architecture described above. For instance, the method may include performing a read or write operation on a memory circuit, including receiving an enable signal directed toward one of the four quadrants. In some examples, the enable signal may be a 4-bit left-right enable (LREN4) signal corresponding to a specification that may be used with some central processing units (CPUs) conforming to ARM register transfer level (RTL) technology. In some examples, LREN4 includes 4 bits (e.g., LREN4<3>, LREN4<2>, LREN4<1>, and LREN4<0>), each of the different quadrants receives a respective LREN4 bit, which determines whether the bit cell core within the quadrant is enabled to perform a read or write operation. However, the scope of implementations is not limited to any particular enable signal specification.

Various implementations may include advantages over other systems. One advantage includes space efficiency. For instance, some implementations may include four quadrants sharing a centrally-located GBC. By contrast, some other systems may include a first bit cell core and a second bit cell core sharing a bank control component as well as a third and a fourth bit cell core sharing another bank control component. Various implementations may benefit from space savings by reducing a number of bank control components used to control the bit cell cores (e.g., one versus two).

Reducing a number of bank control components may provide advantages beyond space savings. For instance, a bank control component would generally be expected to use power and to even have a certain amount of leakage. Thus, reducing a number of bank control components may reduce dynamic read and write power as well as leakage power.

Also, and as noted above, some other systems may use repeater circuits to link memory bit cell cores horizontally within a same iteration of a memory circuit. Specifically, such other systems may build the bit cell cores out horizontally so that the outer bit cell cores may use repeater circuits. By contrast, various implementations described herein use a device with four quadrants built around a central bank control block and may omit or at least reduce a number of repeater circuits compared to the other architectures. As a result, various implementations described herein may be more appropriate for higher-frequency (e.g., 3 GHz and up) performance, including some applications using LREN4 enable signals.

FIG. 1 is a simplified diagram illustrating an example memory circuit 100, according to one implementation, Memory circuit 100 includes four memory cores 101-104. The memory cores 101-404 include a multitude of memory bit cells (memory elements) arranged into rows (words) and columns (bits). At the intersection of each row and column is at least one bit cell. The scope of implementations is not limited to any size for the memory cores 101-104, as any appropriate size memory core may be adapted according to the principles described herein.

Memory circuit 100 also includes global input outputs (GIOs) 121-124. The global input outputs 121, 122 provide data paths into and out of the memory circuit 100 for both read operations and write operations. In this example, each of the memory cores 101-104 are shown with 40 input data paths and 40 output data paths, though the scope of implementations may include a number of data paths scaled as appropriate. Also, in this example, each of the memory cores 101-104 are shown with 64 wordlines, though the scope of implementations may include any appropriate number. In other words, the architecture herein may be adapted to a memory circuit with any appropriate number of wordlines and bitlines. A given GIO may include input latches for both control and data signals, output logic, and the like.

GIOs 121-424 also include local data paths (LDPs). LDPs may include sense amplifiers operable to sense either a digital one or a digital zero being read from a particular memory bit cell during a read operation. An LDP may also include read and write multiplexing, bitline charging and resetting circuitry, write drivers and write assist circuitry, etc.

Global bank controller (GBC) 120 receives control instructions and addresses, pre-decodes those addresses and, through the local bank controllers (LBCs) 125, 126, controls row decoders 110, 111 to access particular wordlines within the memory cores 101-104 for both read and write access. In some implementations, the GBC 120 may include timing control logic, such as clock triggering, self-timing pulse-width control, and latching for clock signal generation. GBC 120 may also include operational mode decision logic, which may determine a read mode or a write mode, input signal latching for both data and control signals, sleep and power-up logic, etc.

Each one of the local bank controllers 125, 126 may include an extension of the address pre-decoding as well as decoding and drivings for global signals into each of the GIOs 121-124. Looking at the LREN signals LREN<0>-<3>, each LREN signal is received at GBC 120 and used to generate the corresponding control signals for each of the GIOs 121-124, then data from each bitcell core 101-104 can be read and written through a respective GIO 121-124. GBC 120 controls a read or write state of each bit cell core 101-104.

Each of the row decoders 110, 111 includes a multitude of individual wordline drivers, which are selected by pre-decoded signals (not shown) output from the respective LBC 125, 126. In one example, memory circuit 100 includes a time-sharing memory architecture in which the cores 101, 102 may be read from or written to during a same cycle of the clock signal and in which the cores 103, 104 may be read from or written to during a same cycle of the clock signal. In some embodiments, each of cores 101-104 may all be read or written to during a same cycle of the clock signal, depending on the corresponding LREN pin's status. Each of the row decoders 110, 111 includes a multitude of selectable wordline drivers in which a wordline with a first index may be driven. Cores 101 and 102 are driven by wordlines from row decoder 110, and cores 103 and 104 are driven by wordlines from row decoder 111.

Figure 2:
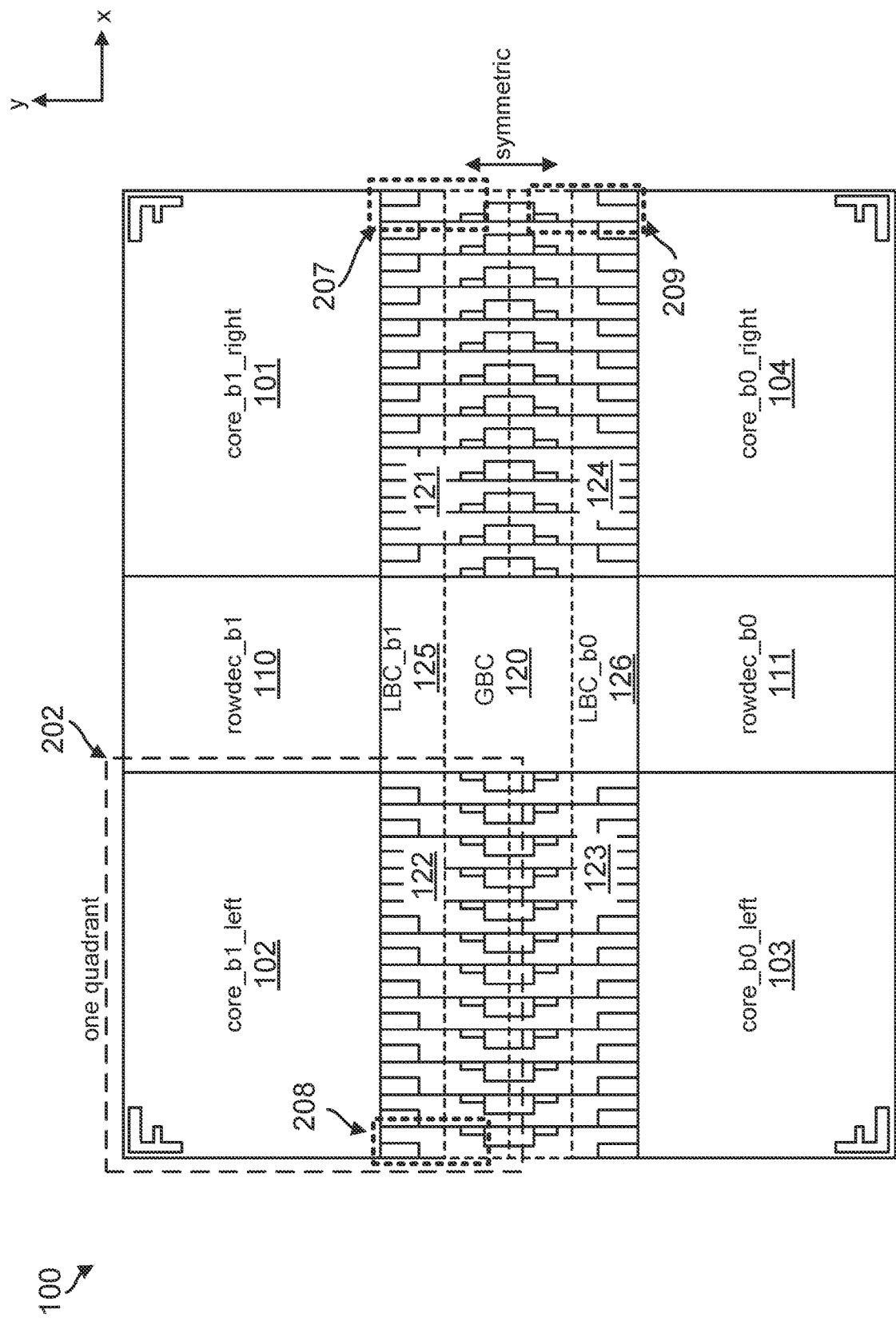
FIG. 2 is an illustration of the example memory circuit of FIG. 1, according to one implementation.
Figure 3:
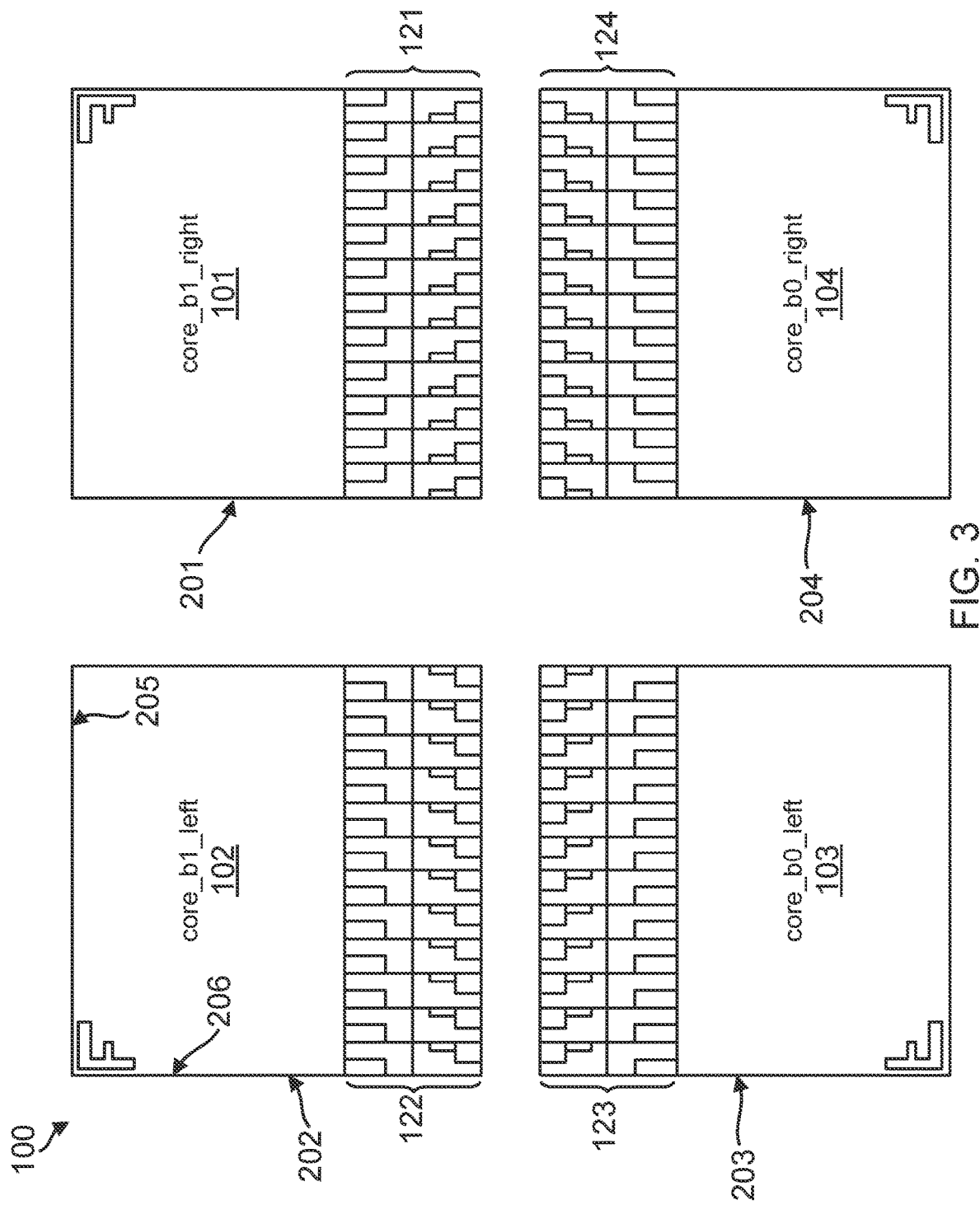
FIG. 3 is an exploded illustration of quadrants in the example memory circuit of FIG. 2, according to one implementation.

Reference is now made to FIG. 2, which is an illustration of the memory circuit 100, but shown with a different scale than in FIG. 1 to illustrate how the memory circuit 100 might be implemented on a semiconductor substrate. FIG. 2 helps to illustrate the quadrants within the memory circuit 100. FIG. 3 is an exploded version of FIG. 2, and it omits row decoders 110, 111, local bank controllers 125, 126, and GBC 120. FIG. 3 is offered for ease of illustration of the four quadrants of FIG. 2—specifically, FIG. 3 includes two quadrants on the top (quadrants 201, 202) and two quadrants on the bottom (quadrants 203, 204).

A dotted box is drawn around a first quadrant 202 in FIG. 2, which includes bit cell core 102 and a set of input output circuits including local data paths and GTO 122. The quadrant 201 is defined by a rectangular boundary that encloses portions of perpendicular edges 205, 206 as shown in FIG. 3, The edges 205, 206 represent physical edges of the memory circuit 100, and when built on a semiconductor substrate, the edges 205, 206 would be expected to provide a border between circuits of the memory circuit 100 and circuits of other devices separate from the memory circuit 100.

The quadrant 203 includes bit cell core 103 as well as a set of input output circuits including local data paths and GIO 123. The quadrant 202 is physically adjacent the quadrant 203, and a border between the quadrants 202, 203 defines an axis about which the quadrants 202, 203 are symmetrical. In this example, the axis of symmetry between quadrants 202, 203 is an x-axis, which is parallel to a direction of wordlines in the bit cell cores 102, 103. Although the quadrants 202, 203 are physically adjacent each other at their respective GIOs 122, 123, the circuits in GIO 122 are not in electrical communication with (i.e., they are electrically isolated from) the circuits in the GIO 123.

Looking now to the quadrants 201, 204, they share a relationship that is similar to the symmetrical relationship of quadrants 202, 203. Specifically, the quadrants 201, 204 are also symmetrical about the horizontal axis, which is also the axis that is parallel to a direction of the wordlines in the bit cell cores 101, 104. Continuing with the example of FIG. 2, the row decoders 110, 111 are also symmetrical about the horizontal axis that separates quadrants 201 and 202 from quadrants 203, 204. In this example, the portion that is not symmetrical about an axis is the central portion that includes local bank controllers 125, 126 and global bank control 120. As a result, the memory circuit 100 itself is symmetrical about the horizontal axis separating quadrants 201 and 202 from quadrants 203 and 204, with the exception of LBCs 125, 126 and GBC 120.

Continuing with the example of FIG. 2, there also exists symmetry along a vertical axis that passes through the middle of row decoders 110, 111, An example of a vertical axis includes an axis that is perpendicular to the wordlines or parallel to the bitlines within the bit cell cores 101-104. Thus, the row decoders 110, 111 may be internally symmetrical about that axis, and the quadrants 201, 204 may be symmetrical with quadrants 202, 203 about that same vertical axis.

As an example of vertical axis symmetry, the circuits in each of the components of the quadrants are symmetrical about the y-axis. For instance, an input output circuit 207 configured to access bit cell core 101 is noted, and it is repeated multiple times within GIO 121. Input output circuit 207 may be vertical axis symmetric with any of the similar circuits in GIO 122, such as input output circuit 208. And as an example of horizontal axis symmetry, input output circuit 207 may be symmetric with input output circuit 209 as well, And those are merely examples, as the symmetries exist in the circuits. For instance, the wordlines, bitlines, and bit cells within bit cell core 102 are horizontal axis symmetrical with respect to the same components in bit cell core 103 and are vertical axis symmetrical with respect to the same components in bit cell core 101. Once again, the exception to symmetry is LBCs 125, 126 and GBC 120, which may not be symmetrical in this example.

For instance, GBC 120 may include an irregular shape that has more or different circuits on the right-hand side than on the left-hand side or vice versa or may have more or different circuits below the centerline than above the central line or vice versa. In one example, the pre-decoding circuitry may not benefit from symmetry and, thus, may be built on silicon in a way that serves a purpose of reducing an amount of silicon area but may not necessarily be symmetrical about the x-axis or the y-axis. In another example, the LBCs 125, 126 may not be physically distinct from GBC 120 and, instead, may be functional components within GBC 120. The LBCs 125, 126 may also be built to serve a purpose of reducing an amount of silicon area but may not necessarily be symmetrical about the x-axis or the y-axis. However, the scope of implementations does not exclude a system in which either the GBC 120 or the LBCs 125, 126 may be symmetrical about a particular axis.

Figure 4:
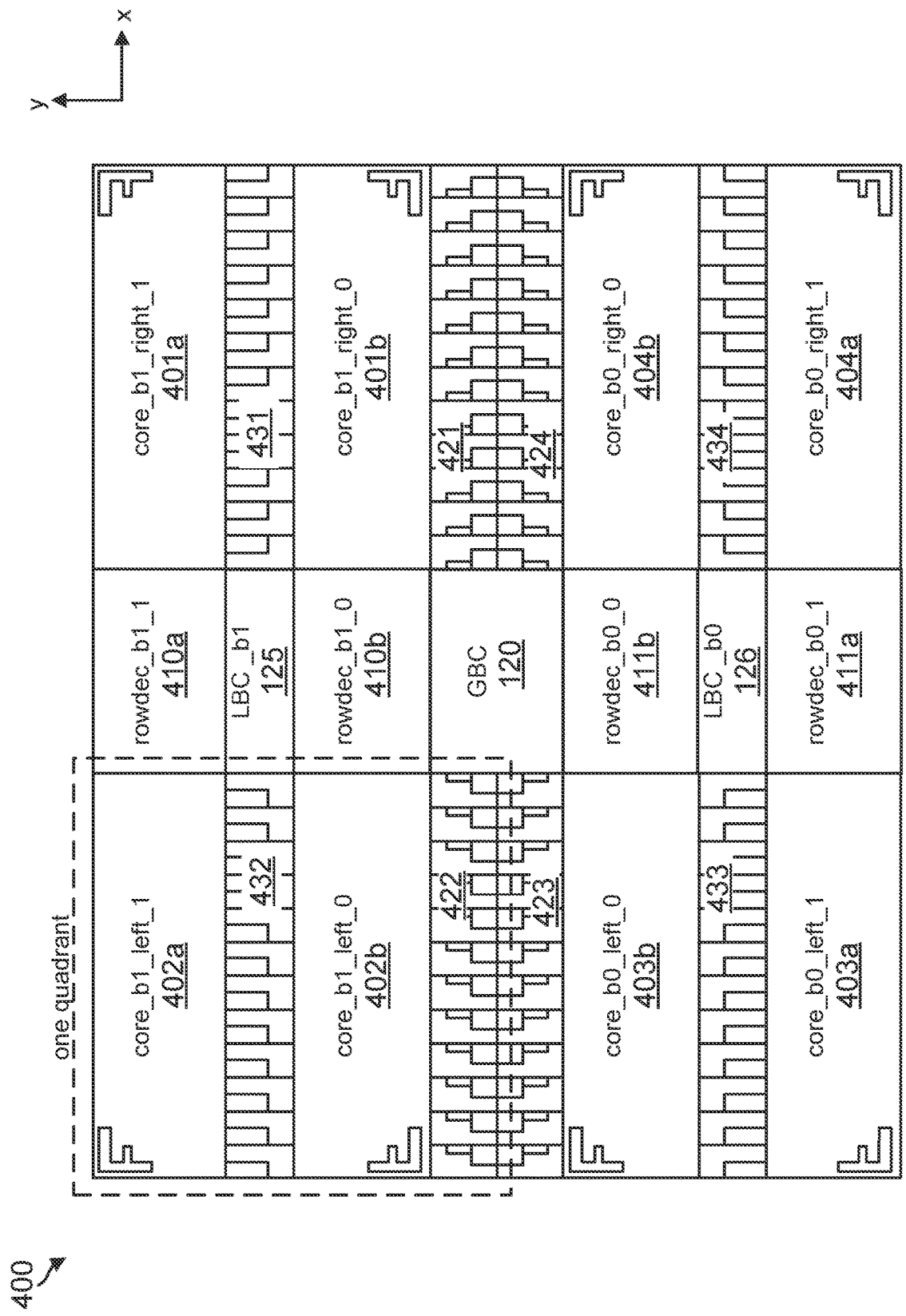
FIG. 4 is an illustration of an example memory circuit, according to one implementation.
Figure 5:
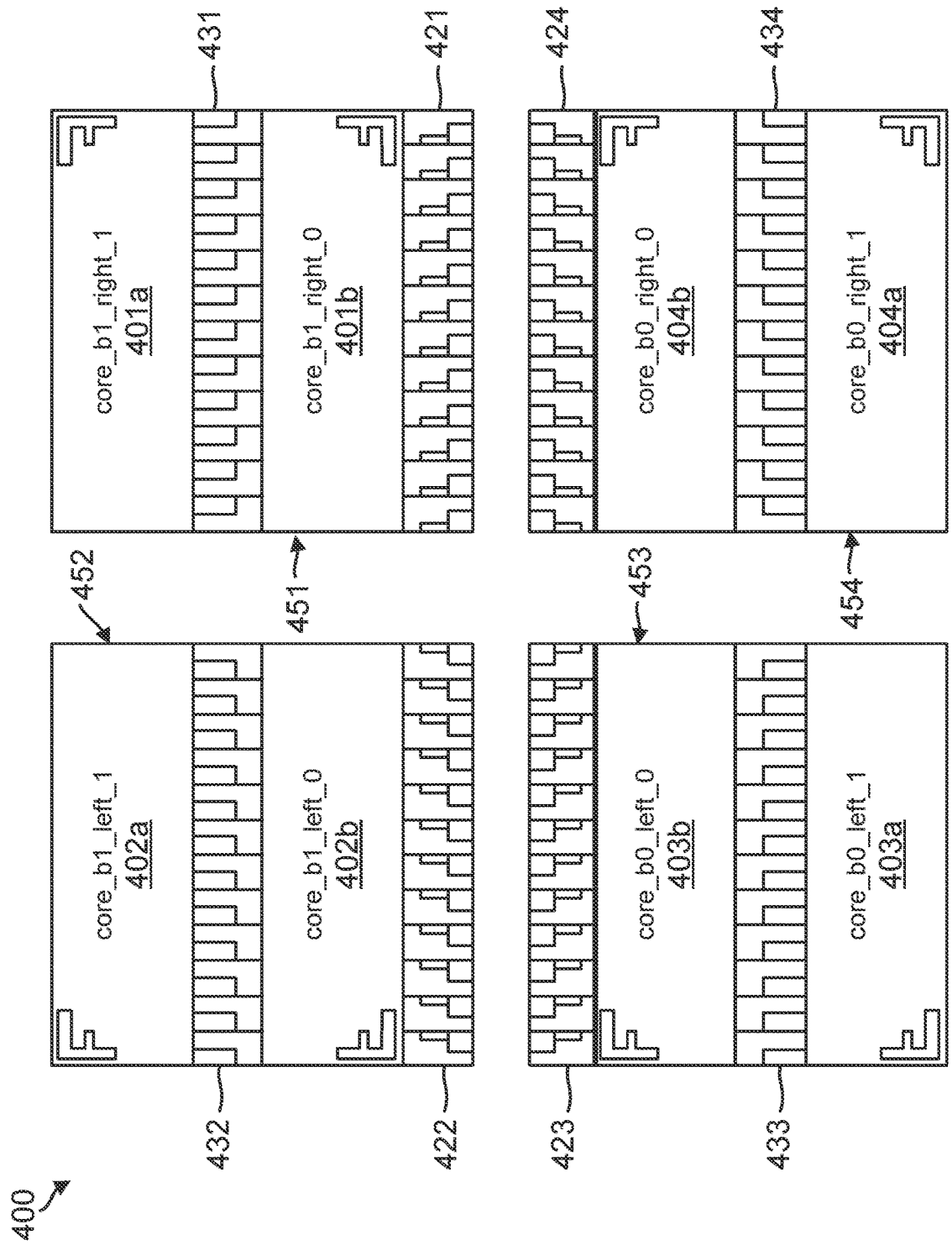
FIG. 5 is an exploded illustration of quadrants in the example memory circuit of FIG. 4.

FIG. 4 is an illustration of an example memory circuit 400, according to one implementation. FIG. 5 is an exploded illustration of the example memory circuit 400, omitting row decoders 410, 411, LBCs 125, 126 and GBC 120.

The implementation of FIG. 4 adapts the symmetry principles of the FIG. 2 implementation within a different architecture. For instance, the implementation of FIG. 4 splits each of the bit cell cores 401-404 into two subparts. Looking at the bit cell core 401 first, it is broken into subparts 401a and 401b. The same is true for the other bit cell cores 402-404. Looking at hit cell core 401 first, the subparts 401a and 401b are separated from each other by local data path circuitry 431. Examples of components within local data path circuitry 431 may include sense amplifiers, multiplexers, bitline reset and pre-charge devices, write drivers, and the like.

Looking to bit cell core 402, it is broken into subparts 402a and 402b, which are separated by local data path circuitry 432. Bit cell core 403 is broken into two subparts 403a and 403b, which are separated by local data path circuitry 433. Similarly, bit cell core 404 is broken into two subparts 404a and 404b, which are separated by local data path circuitry 434. Local data path circuitry 434 and local data path circuitry 433 are both in communication with local bank controller 126. Similarly, local data path circuitry 431 and local data path circuitry 432 are both in communication with local bank controller 125.

Each of the four quadrants 451-454 includes a respective GIO 421-424. Quadrants 451 and 452 are symmetrical with respect to quadrants 454 and 453 about a horizontal axis drawn where GIOs 421, 422 are physically adjacent GIOs 424, 423. For instance, the components of local data path circuitry 431 and the components of local data path circuitry 434 are horizontal axis symmetric, as are the respective components of local data path circuitry 432, 433. Similarly, the wo Wines, bitlines, and other supporting circuitry within memory bit cell core 401 are horizontal axis symmetric with respect to the wordlines, bitlines, and other supporting circuitry within memory bit cell core 404 about that same axis. The same is true of bit cell cores 402 and 403. Furthermore, GIOs 421 and 424 are horizontal axis symmetric, and GIOs 422 and 433 are as well.

The implementation of FIGS. 4 and 5 displays symmetry about a vertical axis (y-axis) extending through the center of GBC 120. For instance, row decoders 410, 411 may also be internally symmetric about that vertical axis, though LBCs 125, 126 and GBC 120 may not have internal symmetry. In other words, and as explained above, the LBCs 125, 126 and GBC 120 can be internally asymmetrical. Continuing with the example, quadrant 451 may be vertical axis symmetric with respect to quadrant 452, and quadrant 454 may be vertical axis symmetric with quadrant 453.

Figure 6:
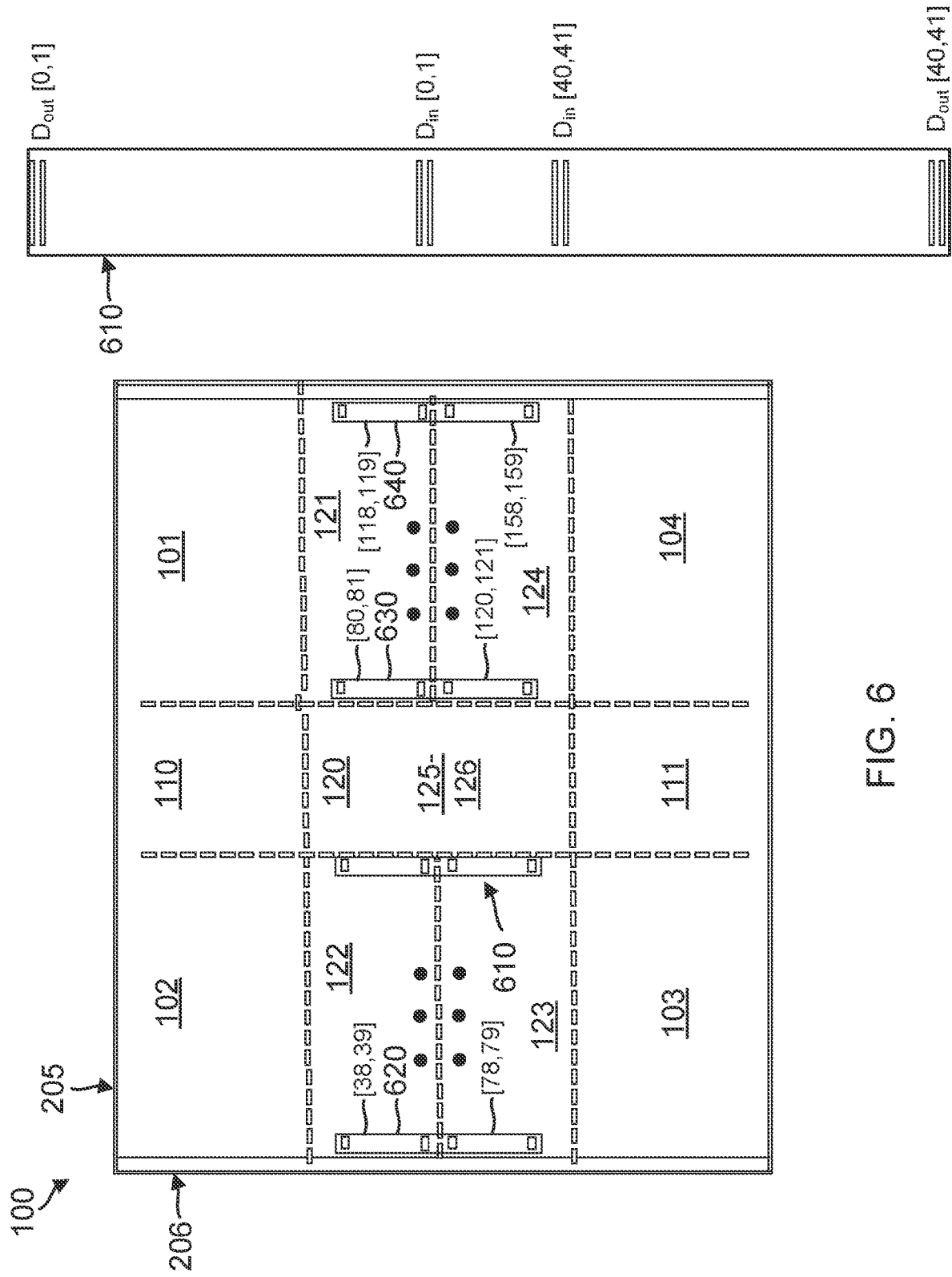
FIG. 6 is an illustration of an example column having input output circuits, such as in the example memory circuit of FIG. 1, according to one implementation.

FIG. 6 is another illustration of memory circuit 100, according to one implementation. FIG. 6 illustrates an arrangement of input pins and output pins in the various quadrants, and specifically focuses on one column 610 of input output pins within the quadrants 202, 203. More specifically, column 610 exists within GIOs 122, 123. Quadrants 201-204 are shown in FIGS. 2-3.

The example of FIG. 6 includes two sets of input pins and output pins in column 610—one input pin set and one output pin set for the quadrant 202 and another input pin set and output pin set for the quadrant 203. The input pin set for quadrant 202 begins at the index 0 (e.g., Din [0, 1]), as does the output pin set for quadrant 202 (e.g., Dout [0, 1]). For quadrant 203, the input pin set begins at the index 40 (e.g., Din [40, 41]), as does the output pin set (e.g., Dout [40, 41]).

Since FIG. 6 shows a column on the left-hand side, this example will continue for convenience going through the left-hand side. Between column 610 and column 620, there are eighteen other columns represented by ellipses for ease of illustration. To the immediate left of the illustrated column 610, another column (not shown) exists that has output pin set Dout [2,3] and [42, 43] and input pin set Din [2,3] and [42, 43]. The leftmost column 620 on the left-hand side would include: Dout [38, 39], Din [38, 39], Din [78, 79] and Dout [78, 79]. The right-hand side quadrants 201, 204 include Din and Dout indices 80-159 in a total of twenty columns represented by columns 630 and 640, with the columns between 630 and 640 being represented by ellipses for ease of illustration. Thus each quadrant has 40 input pins and 40 output pins, and the total pins in the memory circuit 100 are 160 inputs and 160 outputs (i.e., 160 I/Os).

Of course, the specific numbers given in the implementation of FIG. 6 are for example only. In fact, the implementation of FIG. 6 corresponds to an ARM RTL LREN4 128×160 memory, where 128 is the number of wordlines, and 160 is the number of I/Os. Other implementations may scale the number of input and output pins as appropriate and may adopt any register transfer level (RTL) or other technology.

Of note in FIG. 6 is a doubling of pin density within the columns. For instance, column 610 includes two data input pins and two data output pins. By contrast, some other example systems may include only a single data input pin and a single data output pin in a given column. An advantage of the implementation of FIG. 6 is that it may reduce an amount of semiconductor area within the horizontal dimension by using less area for input/output pins.

Figure 7:
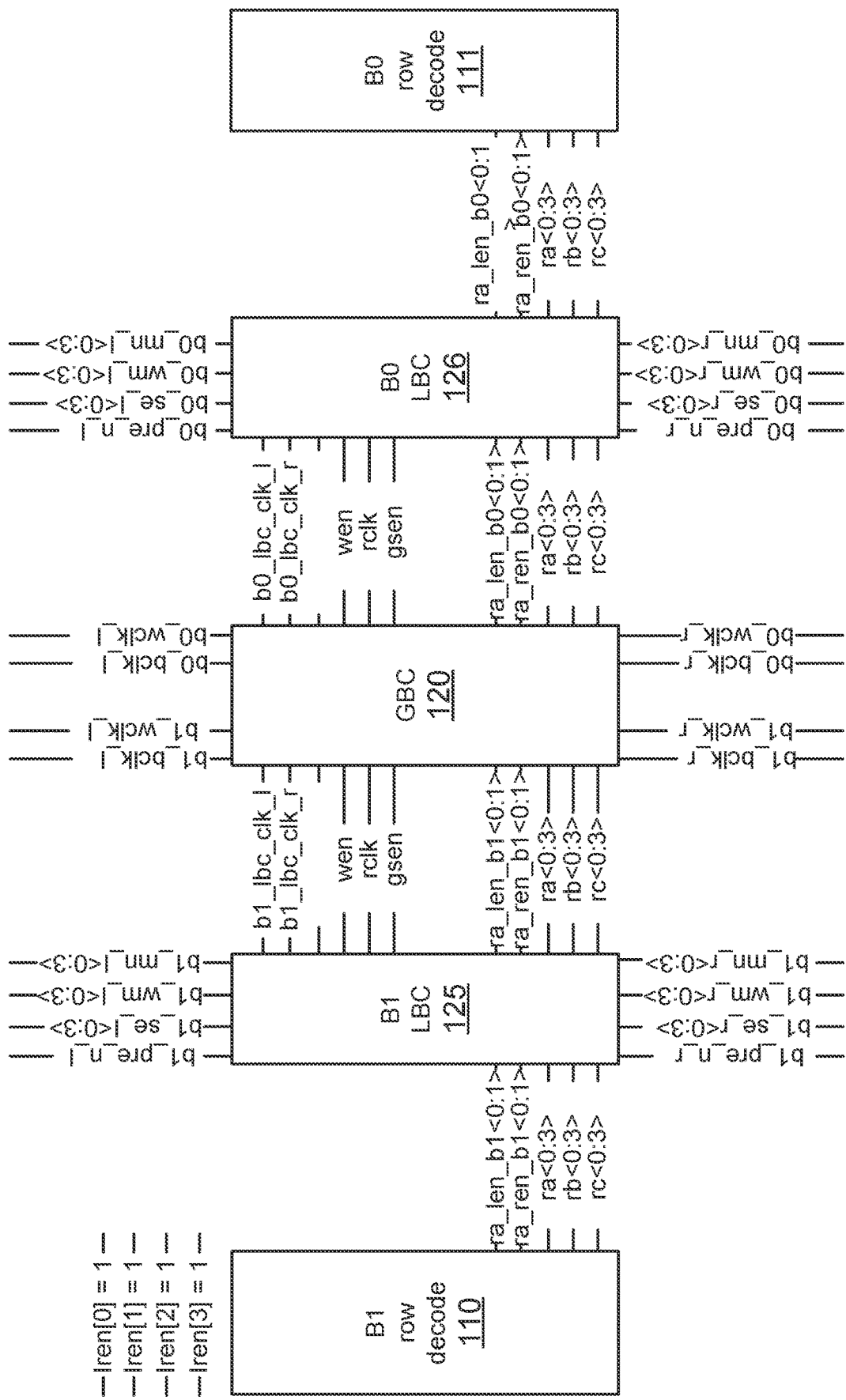
FIG. 7 is an illustration of example signals that may be used with the implementation of FIG. 1.

FIG. 7 is an illustration of the layout and signals of the middle column of the memory circuit 100 of FIGS. 1-3 and 6, according to one implementation. FIG. 7 omits the bit cell memory cores 101-104 for ease of illustration.

The example of FIG. 7 includes four LREN4 signals, lren<0>-<3>, which are received by GBC 120 from outside the memory circuit. For instance, a processor core (not shown) may generate LREN signals to control accessibility of a respective quadrant. The write enable (wen) signal controls reads and writes of the memory device 100.

GBC 120 also includes a respective write clock (wclk) and a respective clock for latching data in signals (bclk) for each one of the bit cell memory cores 101-104. Continuing with the example, row decoder 110 and LBC 125 corresponds to memory bit cell cores 101, 102, and row decoder 111 and LBC 126 corresponds to memory bit cell cores 103, 104. Although not shown here, GIOs 121-124 may receive input data to be written and may output data that was read, and GBC 120 may also receive addresses for reads and writes as well as instructions to perform reads and writes.

GBC 120 receives the addresses and performs pre-decoding, where pre-decoded signals may be used to select particular wordline drivers (not shown) at the row decoders 110, 111. Pre-decoded signals are shown in FIG. 7 as ra_len, ra_ren, ra, rb, rc. The signals ra_len and ra_ren act as core select signals and determine whether a respective core 101-104 is to be read from or written to or not acted upon at all. The signals ra, rb, rc turn on particular ones of the wordline drivers in a core that is selected by a core select signal. GBC 120 includes logic to translate an address into an appropriate pre-decoded signal and to provide that particular pre-decoded signal to the corresponding row decoder 110, 111 to select wordline drivers in one or more of bit cell memory cores 101-104. Those pre-decoded signals are passed through the LBCs 125, 126 as-is or may be modified by the LBCs 125, 126.

GBC 120 also generates clocks for the LBCs 125, 126, and these clocks are shown in FIG. 7 as lbc_clk. The signal wen is a write enable, rclk is a read clock, and gsen is a sense amplifier signal to control gain at sense amplifiers in the local data paths.

LBCs 125, 126 generate signals, including a sense enable signal, se, to enable one or more sense amplifiers (not shown) in the local data paths. The sense enable signals se may be either left or right to address a local data path in either quadrants 202, 203 or 201, 204, The me is true for other signals that are labeled either left or right (l or r)—they are addressed to quadrants 202, 203 or 201, 204 as appropriate. The other signals generated by LBC 125, 126 also control components within the local data paths (signals pre_n, wm, non).

The layout shown in FIG. 7 is different from bank control in existing solutions. For instance, GBC 120 controls two different LBCs 125, 126 and four total memory cell bit cores 101-104. This is apparent by GBC 120 routing signals to each of LBCs 125, 126, where some of those signals are either left or right, thereby indicating one of two memory cell bit cores served by each one of the CBCs 125, 126. By contrast, other systems associating a bank control component with two or fewer memory bit cell cores would not be as complex and would not discriminate between multiple cores at each LBC because each LBC would only support at most a single memory bit cell core.

In some instances, a penalty for increasing a number of transistors in a bank controller to serve four cores versus two cores may be less than the penalty that would be incurred by using two different bank controllers. Therefore, an advantage of some implementations is that the memory circuits 100, 400 may include a GBC 120 that takes up less semiconductor area and uses less dynamic power and experiences less leakage power than would another system having multiple bank controllers for the same number of memory bit cell cores.

Furthermore, another advantage of some implementations is that the memory circuits 100, 400 may conform to a protocol using four different enable signals and four different memory bit cell cores (e.g., LREN4) while being treated as a single macro element during design time. By contrast, some systems including fewer than four memory bit cell cores may have to be combined during design time using multiple macro elements to support a protocol such as LREN4. Thus, some implementations may simplify design time for some designs.

Furthermore, it should be noted that the scope of implementations is not limited to any particular protocol, such as LREN4. Rather, various implementations may adopt any technology to either increase or decrease a number of enable signals or to use different types of enable signals.

Various implementations described herein may be suitable for use in a system on chip (SOC). An example of a SOC includes a semiconductor chip having multiple processing devices within it, including a graphics processing unit (GPU), a central processing unit (CPU), a modem unit, a camera unit, and the like. In some examples, the SOC may be included within a chip package, mounted on a printed circuit board, and disposed within a portable device, such as a smart phone or tablet computer. However, the scope of implementations is not limited to a chip implemented within a tablet computer or smart phone, as other applications are possible.

Figure 8:
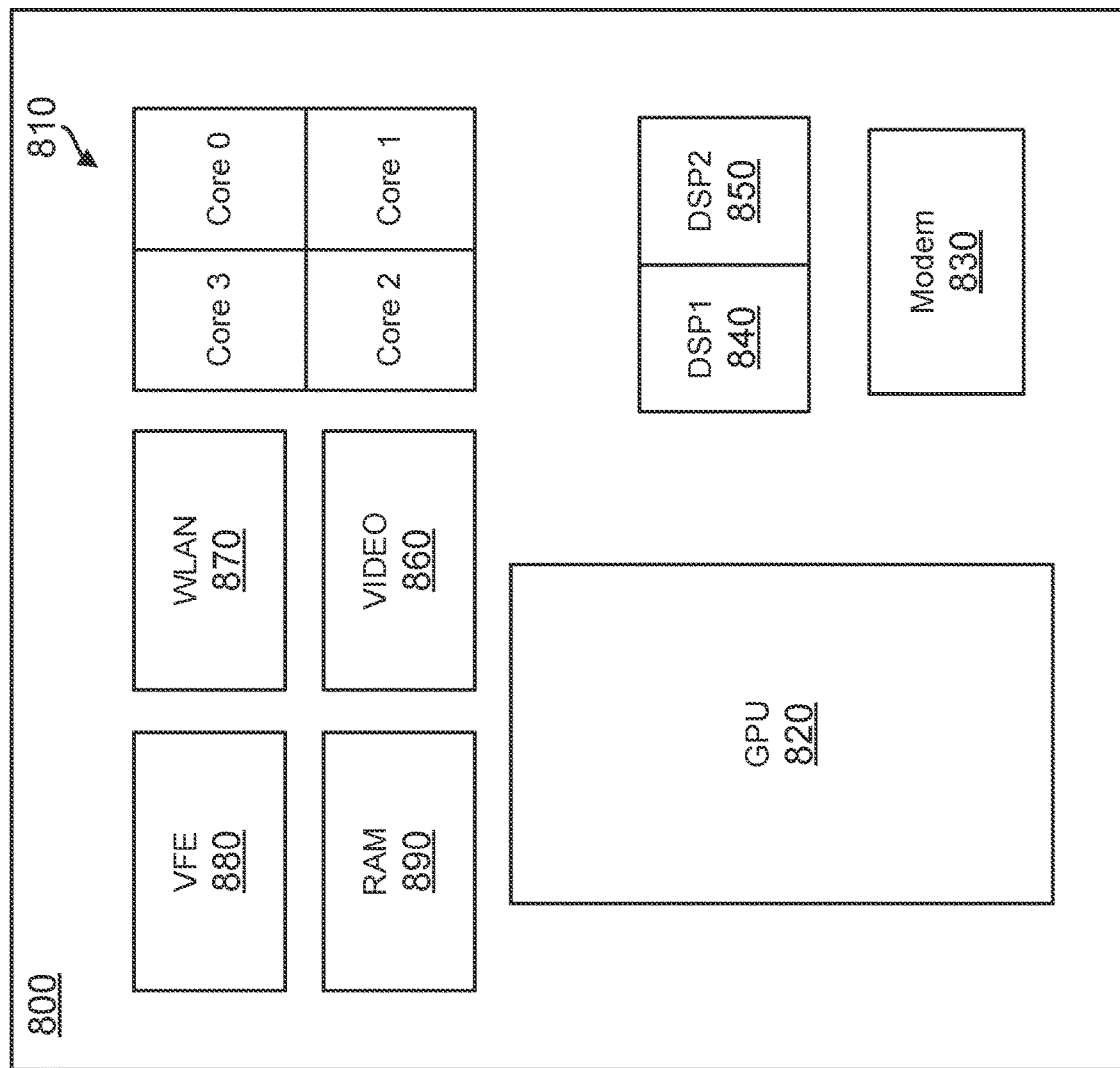
FIG. 8 is an illustration of an example system on chip (SOC), in which may be built memory circuits having, such as those illustrated in FIGS. 1-7, according to one implementation

FIG. 8 is an illustration of example SOC 800, according to one implementation. In this example, SOC 800 is implemented on a semiconductor die, and it includes multiple system components 810-890. Specifically, in this example, SOC 800 includes CPU 810 that is a multi-core general-purpose processor having four processor cores, core 0-core 3. Of course, the scope of implementations is not limited to any particular number of cores, as other implementations may include two cores, eight cores, or any other appropriate number of cores in the CPU 810. SOC 800 further includes other system components, such as a first digital signal processor (DSP) 840, a second DSP 850, a modem 830, GPU 820, a video subsystem 860, a wireless local area network (WLAN) transceiver 870, and a video-front-end (VFE) subsystem 880.

SOC 800 also includes RAM memory circuit 890. In this example, RAM memory circuit 890 may include one or more memory circuits that correspond to the architectures described above with respect to FIGS. 1-7. The implementations described herein may be adapted for use in any RAM memory circuit. For instance, in this example SOC 800 may include standalone RAM memory circuit 890, and there may be other RAM components in other processing units, such as GPU 820, modem unit 130, DSPs 140, 150, or the like. Those RAM units may also be adapted according to the architectures described above with respect to FIGS. 1-7.

As noted above, SOC 800 may include a CPU 810 having multiple cores 0-3, and one or more of those cores may execute computer-readable code providing the functionality of an operating system kernel. Furthermore, the example operating system kernel may include memory management logic that may perform read and write operations on various memory circuits, such as RAM memory circuits described herein. Accordingly, the principles described with respect to FIGS. 1-7 and 9 may be implemented in SOC 800 and, more specifically, the circuits and methods shown in FIGS. 1-7 and 9 may be implemented in SOC 800 or other chip to provide memory read and write functionality. For instance, an operating system kernel with memory management logic may generate the signals described in FIGS. 1 and 7, such as lren, wclk, and the like, to perform a read or write operation.

Figure 9:
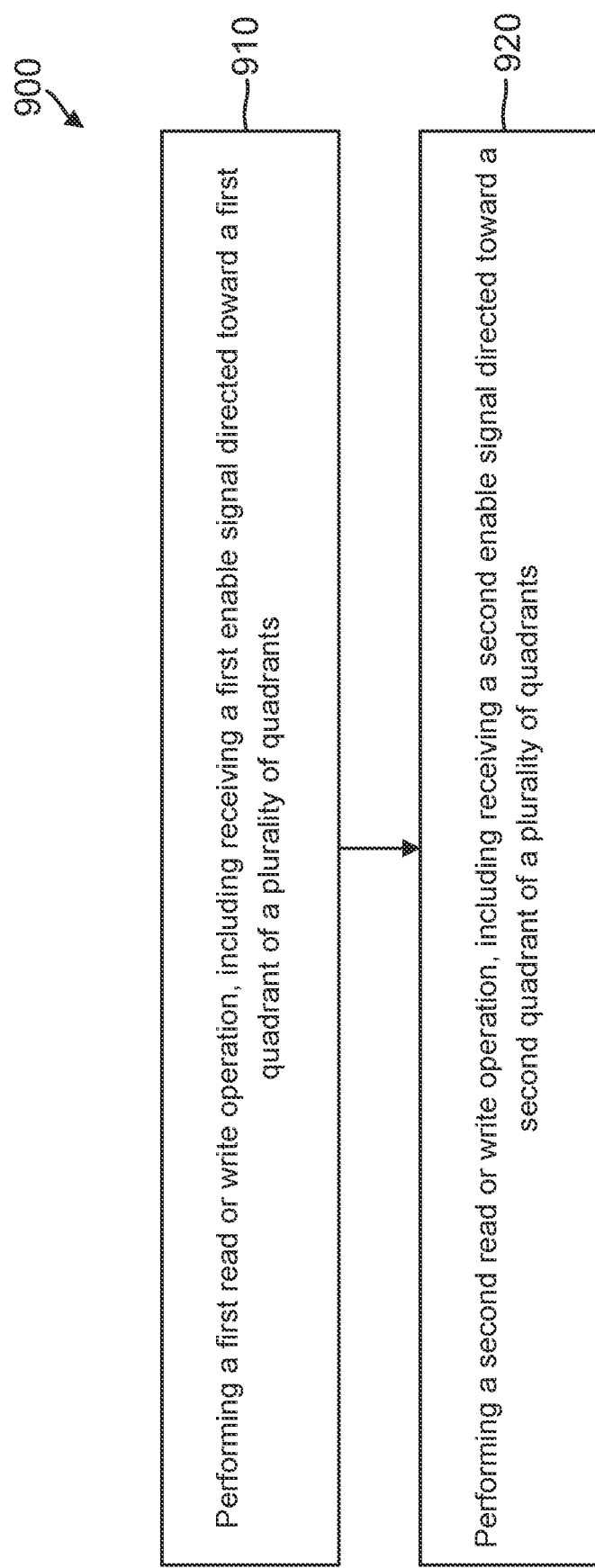
FIG. 9 is an illustration of a method of using the memory circuits of FIGS. 1-7, according to one implementation.

A flow diagram of an example method 900 of performing reads and writes is illustrated in FIG. 9, according to one implementation. In one example, method 900 is performed by any of the memory circuits shown in FIGS. 1-7. In some examples, a memory management unit either within or outside of a CPU or GPU includes processing circuitry that executes computer readable instructions to perform a read or write operation on a RAM memory circuit by controlling a GBC (e.g., GBC 120 of FIGS. 1 and 4). For instance, logic in a CPU or a GPU may send address and control signals to a GBC to cause the GBC to either read or write data. An example of a control signal may include a left right enable signal, such as may conform to LREN4.

At action 910, the method includes performing a first read or write operation. Action 910 may include receiving a first enable signal directed toward a first quadrant of a plurality of quadrants. In the example of FIGS. 1-3, a first enable signal may include LREN<0>, received by GM 122 at quadrant 202. While the enable signal may be received by GIO 122, it may be passed to a bank control component, such as GBC 120.

Action 910 may also include receiving address signals and data in the case of a write operation. For instance, the address signals may indicate a particular address to which the data should be saved. The bank controller may pre-decode the address signal to select one or more wordline drivers in a memory bit cell core of the quadrant based on the pre-decoded signals.

In some examples, action 910 may include receiving address signals in the case of a read operation. Once again, a bank control circuit may pre-decode the address signals to select one or more wordline drivers in a memory bit cell core of the quadrant based on the pre-decoded signals.

At action 920, the method includes performing a second read or write operation. Action 920 may include receiving a second enable signal directed toward a second quadrant of the plurality of quadrants. In the example of FIGS. 1-3, a second enable signal may include any of LREN<1-3>, corresponding to any of the respective quadrants 203, 201, and 704.

As with action 910, action 920 may include receiving address signals and control signals, pre-decoding those address signals, and either reading or writing data by selecting one or more wordline drivers within a memory bit cell core within a quadrant that is selected by the particular enable signal.

The scope of implementations is not limited to the specific actions shown in FIG. 9. Rather, other implementations may add, omit, rearrange, or modify one or more the actions. In one example, actions 910 and 920 may overlap in time, as the memory circuits 100, 400 may perform read and write operations in multiple quadrants simultaneously. Thus, action 910 may be performed with respect to a first quadrant, while at the same time action 920 may be performed with respect to a second quadrant. In fact, the architecture of memory circuits 100, 400 may allow up to four read/write operations to be performed simultaneously by utilizing the four quadrants at, the same time. However, there is no requirement that any particular number of quadrants must be read from or written to during any particular clock cycle.

Furthermore, an implementation may repeat actions 910 and/or 920 each clock cycle or, at least, in subsequent non-consecutive cycles in ones of the quadrants. In other words, method 900 may include reading or writing any one or more of the quadrants during a particular clock cycle and then reading or writing any one or more of the quadrants during a next clock cycle, and on and on. The actions of method 900 may be performed as many times as appropriate to read or write requested data. When a wordline is driven, it allows a byte of data to be read from memory, where that byte of data is either written to or read from a physical location in the memory circuit corresponding to a logical location that is known to a CPU, GPU, or other processing device. Multiple clock cycles may be used to read or write multiple bytes of data with as many clock cycles used as appropriate for the size of the read or write request, and this is true for each of the quadrants.

EXAMPLE EMBODIMENTS

Embodiment 1: A semiconductor device comprising:
a memory circuit having a plurality of quadrants arranged at corners of the memory circuit and surrounding a bank control component;
wherein a first quadrant of the plurality of quadrants includes a first bit cell core and a first set of input output circuits configured to access the first bit cell core, the first quadrant defined by a rectangular boundary that encloses portions of two perpendicular edges of the memory circuit;
wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical.

Embodiment 2: The semiconductor device of embodiment 1, wherein the border is parallel to a direction of wordlines in the first bit cell core.

Embodiment 3: The semiconductor device of embodiment 1 or embodiment 2, further comprising:
a third quadrant of the plurality of quadrants, which includes a third bit cell core and a third set of input output circuits configured to access the third bit cell core, the third quadrant being symmetrical with the first quadrant along a second axis that is perpendicular to a direction of wordlines in the first bit cell core.

Embodiment 4: The semiconductor device of embodiment 3, further comprising:
a row decoder placed between the first quadrant and the third quadrant and adjacent the bank control component.

Embodiment 5: The semiconductor device of embodiment 3 or embodiment 4, further comprising:
a fourth quadrant of the plurality of quadrants, which includes a fourth hit cell core and a fourth set of input output circuits configured to access the fourth bit cell core, the fourth quadrant being adjacent the third quadrant and symmetrical with the third quadrant along the first axis.

Embodiment 6: The semiconductor device of embodiment 5, further comprising:
a row decoder placed between the second quadrant and the fourth quadrant and adjacent the bank control component, Embodiment 7: The semiconductor device of any preceding embodiment, wherein the first set of input output circuits and the second set of input output circuits are laid out adjacent each other in the semiconductor device, further wherein the first set of input output circuits are electrically isolated from the second set of input output circuits.

Embodiment 8: The semiconductor device of any preceding embodiment, wherein the first quadrant further comprises:

an additional bit cell core separated from the first bit cell core by a set of sense amplifiers configured to access the additional bit cell core.

Embodiment 9: The semiconductor device of any preceding embodiment, wherein the bank control component comprises pre-decoding circuitry configured to access each quadrant of the plurality of quadrants.

Embodiment 10: The semiconductor device of any preceding embodiment, wherein the memory circuit is in communication with four left right enable signals from outside the memory circuit.

Embodiment 11: A method of operating a semiconductor device, the method comprising:

performing an input output operation on a memory circuit, including receiving an enable signal directed toward a first quadrant of a plurality of quadrants arranged at corners of the memory circuit and surrounding a bank control component;

wherein the first quadrant of the plurality of quadrants includes a first bit cell core and a first set of input output circuits configured to access the first bit cell core, the first quadrant defined by a rectangular boundary that encloses portions of two perpendicular edges of the memory circuit;

wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical;

wherein performing the input output operation on the memory circuit includes performing pre-decoding at the bank control component and activating word line drivers in a row decoder according to the pre-decoding.

Embodiment 12: The method of embodiment 11, further comprising:

wherein the input output operation comprises a read operation or a write operation.

Embodiment 13: The method of embodiment 11 or embodiment 12, further comprising:

performing an additional input output operation at the second bit cell core.

Embodiment 14: The method of any of embodiments 11 to 13, further comprising a third quadrant, wherein the third quadrant includes a third bit cell core and a third set of input output circuits configured to access the third bit cell core, the third quadrant being separated from the first quadrant by the row decoder, wherein a second axis is perpendicular to the first axis, and wherein the first quadrant and the third quadrant are symmetrical about the second axis.

Embodiment 15: The method of embodiment 14, further comprising:

performing an additional input output operation at the third bit cell core.

Embodiment 16: The method of embodiment 15, wherein the input output operation and the additional input output operation are performed simultaneously.

Embodiment 17: The method of embodiment 15, wherein performing the additional input output operation comprises:

receiving an additional enable signal directed toward the third quadrant.

Embodiment 18: The method of embodiment 15, wherein performing the additional input output operation comprises:

activating the word line drivers in the row decoder according to the pre-decoding.

Embodiment 19: A system on chip (SOC) comprising:

a random-access memory (RAM) device comprising a plurality of quadrants arranged around corners of a rectangular shape of the RAM device;

wherein a first quadrant of the plurality of quadrants is defined by a first boundary that encloses portions of two perpendicular edges of the RAM device;

wherein a second quadrant of the plurality of quadrants is horizontal axis symmetrical with respect to the first quadrant; and wherein a third quadrant of the plurality of quadrants is vertical axis symmetrical with respect to the first quadrant.

Embodiment 20: The SOC of embodiment 19, further comprising a bank control device, common to each of the plurality of quadrants, wherein the bank control device is internally asymmetrical.

Embodiment 21: The SOC of embodiment 19 or embodiment 20, wherein the first quadrant comprises a first bit cell core and a first set of input output circuits.

Embodiment 22: The SOC of any of embodiments 19 to 21, wherein the second quadrant is adjacent the first quadrant, and wherein a border between the first quadrant and the second quadrant defines a first axis about which the first quadrant and the second quadrant are symmetrical.

Embodiment 23: The SOC of any of embodiments 19 to 22, wherein the first quadrant and the third quadrant are separated by a row decoder having a plurality of word line drivers, wherein the first quadrant and the third quadrant are symmetrical about a vertical axis bisecting the row decoder.

Embodiment 24: The SOC of any of embodiments 19 to 23, wherein a fourth quadrant of the plurality of quadrants is horizontal axis symmetrical with respect to the third quadrant.

Embodiment 25: The SOC of embodiment 24, wherein the fourth quadrant is separated from the second quadrant by a row decoder, wherein the second quadrant and the fourth quadrant are symmetrical about a vertical axis bisecting the row decoder.

Embodiment 26: A system on chip (SOC) comprising:

a memory circuit having a plurality of quadrants arranged at corners of the memory circuit and surrounding means for pre-decoding address signals;

wherein a first quadrant of the plurality of quadrants includes first means for storing data and a first set of input output circuits configured to access the first data storing means, the first quadrant defined by a rectangular boundary that encloses portions of two perpendicular edges of the memory circuit;

wherein a second quadrant of the plurality of quadrants includes second means for storing data and a second set of input output circuits configured to access the second data storing means, wherein a border between the first quadrant and the second quadrant defines a first axis about which the first quadrant and the second quadrant are symmetrical.

Embodiment 27: The SOC of embodiment 26, wherein the first data storing means comprises a first bit cell core having a first plurality of memory elements.

Embodiment 28: The SOC of embodiment 26 or embodiment 27, wherein the second data storing means comprises a second bit cell core having a second plurality of memory elements.

Embodiment 29: The SOC of any of embodiments 26 to 28, wherein the means for pre-decoding address signals comprises a global bank controller in communication with each of the quadrants.

Embodiment 30: The SOC of embodiment 29, wherein the global bank controller is internally asymmetrical.

Embodiment 31: The SOC of any of embodiments 26 to 30, wherein a third quadrant of the plurality of quadrants includes third means for storing data and a third set of input output circuits configured to access the third data storing means, wherein the first quadrant and the third quadrant are symmetrical about a second axis bisecting a row decoder placed between the first quadrant and the third quadrant.

Embodiment 32: The SOC of embodiment 31, wherein the second axis is perpendicular to a direction of wordlines in the first quadrant.

Embodiment 33: The SOC of any of embodiments 26 to 32, wherein the first axis is parallel to a direction of wordlines in the first quadrant.

Embodiment 34: The SOC of any of embodiments 26 to 33, wherein the first set of input output circuits and the second set of input output circuits are laid out adjacent each other in the SOC, further wherein the first set of input output circuits are electrically isolated from the second set of input output circuits.

Embodiment 35: The SOC of any of embodiments 26 to 34, wherein the memory circuit is in communication with four left right enable signals from outside the memory circuit. Embodiment 36: The SOC of any of embodiments 26 to 34, wherein the first quadrant has input pins and output pins arranged in a plurality of columns, each column having two input pins and two output pins. Embodiment 37: A semiconductor device comprising:

a memory circuit having a plurality of quadrants arranged at corners of the memory circuit and surrounding a bank control component;

wherein a first quadrant of the plurality of quadrants includes a first bit cell core, the first quadrant defined by a rectangular boundary that encloses portions of two perpendicular edges of the memory circuit;

wherein a second quadrant of the plurality of quadrants includes a second bit cell core, the second quadrant being adjacent the first quadrant, wherein a border between the first quadrant and the second quadrant defines a first axis about which the first quadrant and the second quadrant are symmetrical.

Embodiment 38: The semiconductor device of embodiment 1, wherein the border is parallel to a direction of wordlines in the first bit cell core.

Embodiment 39: The semiconductor device of embodiment 1 or embodiment 2, further comprising:

a third quadrant of the plurality of quadrants, which includes a third bit cell core, the third quadrant being symmetrical with the first quadrant along a second axis that is perpendicular to a direction of wordlines in the first bit cell core.

Embodiment 40: The semiconductor device of embodiment 39, further comprising:

a row decoder placed between the first quadrant and the third quadrant and adjacent the bank control component.

Embodiment 41: The semiconductor device of embodiment 39 or embodiment 40, further comprising:

a fourth quadrant of the plurality of quadrants, which includes a fourth bit cell core, the fourth quadrant being adjacent the third quadrant and symmetrical with the third quadrant along the first axis.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A semiconductor device comprising:
   a memory circuit having a plurality of quadrants arranged at corners of the memory circuit and surrounding a bank control component;
   wherein a first quadrant of the plurality of quadrants includes a first bit cell core and a first set of input output circuits configured to access the first bit cell core, the first quadrant defined by a rectangular boundary that encloses portions of two perpendicular edges of the memory circuit; and
   wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical.

2. The semiconductor device of claim 1, wherein the border is parallel to a direction of wordlines in the first bit cell core.

3. The semiconductor device of claim 1, further comprising:
   a third quadrant of the plurality of quadrants, which includes a third bit cell core and a third set of input output circuits configured to access the third bit cell core, the third quadrant being symmetrical with the first quadrant along a second axis that is perpendicular to a direction of wordlines in the first bit cell core.

4. The semiconductor device of claim 3, further comprising:
   a row decoder placed between the first quadrant and the third quadrant and adjacent the bank control component.

5. The semiconductor device of claim 3, further comprising:
   a fourth quadrant of the plurality of quadrants, which includes a fourth bit cell core and a fourth set of input output circuits configured to access the fourth bit cell core, the fourth quadrant being adjacent the third quadrant and symmetrical with the third quadrant along the first axis.

6. The semiconductor device of claim 5, further comprising:
   a row decoder placed between the second quadrant and the fourth quadrant and adjacent the bank control component.

7. The semiconductor device of claim 1, wherein the first set of input output circuits and the second set of input output circuits are adjacent each other in the semiconductor device, further wherein the first set of input output circuits are electrically isolated from the second set of input output circuits.

8. The semiconductor device of claim 1, wherein the first quadrant further comprises:
an additional bit cell core separated from the first bit cell core by a set of sense amplifiers configured to access the additional bit cell core.

9. The semiconductor device of claim 1, wherein the bank control component comprises pre-decoding circuitry configured to access each quadrant of the plurality of quadrants.

10. The semiconductor device of claim 1, wherein the memory circuit is in communication with four enable signals from outside the memory circuit.

11. A method of operating a semiconductor device, the method comprising:
performing an input or output operation on a memory circuit, including receiving an enable signal directed toward a first quadrant of a plurality of quadrants arranged at corners of the memory circuit and surrounding a bank control component;
wherein the first quadrant of the plurality of quadrants includes a first bit cell core and a first set of input output circuits configured to access the first bit cell core, the first quadrant defined by a rectangular boundary that encloses portions of two perpendicular edges of the memory circuit;
wherein a second quadrant of the plurality of quadrants includes a second bit cell core and a second set of input output circuits configured to access the second bit cell core, the second quadrant being adjacent the first quadrant, wherein a border between the first quadrant and the second quadrant defines a first axis about which the first quadrant and the second quadrant are symmetrical;
wherein performing the input or output operation on the memory circuit includes performing pre-decoding at the bank control component and activating word line drivers in a row decoder according to the pre-decoding.

12. The method of claim 11, further comprising:
wherein the input or output operation comprises a read operation or a write operation.

13. The method of claim 11, further comprising:
performing an additional input or output operation at the second bit cell core.

14. The method of claim 11, further comprising a third quadrant, wherein the third quadrant includes a third bit cell core and a third set of input output circuits configured to access the third bit cell core, the third quadrant being separated from the first quadrant by the row decoder, wherein a second axis is perpendicular to the first axis, and wherein the first quadrant and the third quadrant are symmetrical about the second axis.

15. The method of claim 14, further comprising:
performing an additional input or output operation at the third bit cell core.

16. The method of claim 15, wherein the input or output operation and the additional input or output operation are performed simultaneously.

17. The method of claim 15, wherein performing the additional input or output operation comprises:
receiving an additional enable signal directed toward the third quadrant.

18. The method of claim 15, wherein performing the additional input or output operation comprises:
activating the word line drivers in the row decoder according to the pre-decoding.

19. A system on chip (SOC) comprising:
a random-access memory (RAM) device comprising a plurality of quadrants arranged around corners of a rectangular shape of the RAM device;
wherein a first quadrant of the plurality of quadrants is defined by a first boundary that encloses portions of two perpendicular edges of the RAM device;
wherein a second quadrant of the plurality of quadrants is horizontal axis symmetrical with respect to the first quadrant; and
wherein a third quadrant of the plurality of quadrants is vertical axis symmetrical with respect to the first quadrant.

20. The SOC of claim 19, further comprising a bank control component, common to each of the plurality of quadrants, wherein the bank control component is internally asymmetrical.

21. The SOC of claim 19, wherein the first quadrant comprises a first bit cell core and a first set of input output circuits.

22. The SOC of claim 19, wherein the second quadrant is adjacent the first quadrant, and wherein a border between the first quadrant and the second quadrant defines a first axis about which the first quadrant and the second quadrant are symmetrical.

23. The SOC of claim 19, wherein the first quadrant and the third quadrant are separated by a row decoder having a plurality of word line drivers, wherein the first quadrant and the third quadrant are symmetrical about a vertical axis bisecting the row decoder.

24. The SOC of claim 19, wherein a fourth quadrant of the plurality of quadrants is horizontal axis symmetrical with respect to the third quadrant.

25. The SOC of claim 24, wherein the fourth quadrant is separated from the second quadrant by a row decoder, wherein the second quadrant and the fourth quadrant are symmetrical about a vertical axis bisecting the row decoder.

26. A system on chip (SOC) comprising:
a memory circuit having a plurality of quadrants arranged at corners of the memory circuit and surrounding means for pre-decoding address signals;
wherein a first quadrant of the plurality of quadrants includes first means for storing data and a first set of input output circuits configured to access the first data storing means, the first quadrant defined by a rectangular boundary that encloses portions of two perpendicular edges of the memory circuit;
wherein a second quadrant of the plurality of quadrants includes second means for storing data and a second set of input output circuits configured to access the second data storing means, wherein a border between the first quadrant and the second quadrant defines a first axis about which the first quadrant and the second quadrant are symmetrical.

27. The SOC of claim 26, wherein the first data storing means comprises a first bit cell core having a first plurality of memory elements.

28. The SOC of claim 27, wherein the second data storing means comprises a second bit cell core having a second plurality of memory elements.

29. The SOC of claim 26, wherein the means for pre-decoding address signals comprises a global bank controller in communication with each of the quadrants.

30. The SOC of claim 29, wherein the global bank controller is internally asymmetrical.

31. The SOC of claim 29, wherein a third quadrant of the plurality of quadrants includes third means for storing data and a third set of input output circuits configured to access the third data storing means, wherein the first quadrant and the third quadrant are symmetrical about a second axis bisecting a row decoder placed between the first quadrant and the third quadrant.

32. The SOC of claim 31, wherein the second axis is perpendicular to a direction of wordlines in the first quadrant.

33. The SOC of claim 26, wherein the first axis is parallel to a direction of wordlines in the first quadrant.

34. The SOC of claim 26, wherein the first set of input output circuits and the second set of input output circuits are laid out adjacent each other in the SOC, further wherein the first set of input output circuits are electrically isolated from the second set of input output circuits.

35. The SOC of claim 26, wherein the memory circuit is in communication with four enable signals from outside the memory circuit.

36. The SOC of claim 26, wherein the first quadrant has input pins and output pins arranged in a plurality of columns, each column having two input pins and two output pins.

37. A semiconductor device comprising:
a memory circuit having a plurality of quadrants arranged at corners of the memory circuit and surrounding a bank control component;
wherein a first quadrant of the plurality of quadrants includes a first bit cell core, the first quadrant defined by a rectangular boundary that encloses portions of two perpendicular edges of the memory circuit; and
wherein a second quadrant of the plurality of quadrants includes a second bit cell core, the second quadrant being adjacent the first quadrant, wherein a border between the first quadrant and the second quadrant defines a first axis about which the first quadrant and the second quadrant are symmetrical.

38. The semiconductor device of claim 37, wherein the border is parallel to a direction of wordlines in the first bit cell core.

39. The semiconductor device of claim 37, further comprising:
a third quadrant of the plurality of quadrants, which includes a third bit cell core, the third quadrant being symmetrical with the first quadrant along a second axis that is perpendicular to a direction of wordlines in the first bit cell core.

40. The semiconductor device of claim 39, further comprising:
a row decoder placed between the first quadrant and the third quadrant and adjacent the bank control component.

41. The semiconductor device of claim 39, further comprising:
a fourth quadrant of the plurality of quadrants, which includes a fourth bit cell core, the fourth quadrant being adjacent the third quadrant and symmetrical with the third quadrant along the first axis.

* * * * *